(12) United States Patent
Joyner et al.

(10) Patent No.: US 6,376,285 B1
(45) Date of Patent: Apr. 23, 2002

(54) ANNEALED POROUS SILICON WITH EPITAXIAL LAYER FOR SOI

(75) Inventors: Keith A. Joyner, Richardson; Leland S. Swanson, McKinney, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/314,983

(22) Filed: May 20, 1999

Related U.S. Application Data

(60) Provisional application No. 60/086,959, filed on May 28, 1998.

(51) Int. Cl.$^7$ .............................................. H01L 21/00
(52) U.S. Cl. ...................... 438/149; 438/150; 438/453; 205/656; 205/660; 205/662; 205/674
(58) Field of Search ................................ 438/150, 149, 438/453, 454, 749, 750, 751; 205/656, 660, 662, 674

(56) References Cited

U.S. PATENT DOCUMENTS 5,810,994 A * 9/1998 Lee et al. .................... 205/656
6,103,598 A * 8/2000 Yamagata et al. .......... 438/459

* cited by examiner

*Primary Examiner*—David Nelms
*Assistant Examiner*—Reneé R. Berry
(74) *Attorney, Agent, or Firm*—Jacqueline J. Garner; W. James Brady, III; Frederick J. Telecky, Jr.

(57) ABSTRACT

An epitaxial layer of silicon is grown on a layer of partially-oxidized porous silicon, then covered by a capping layer which provides structural support and prevents oxidation of the epitaxial layer. A high-temperature anneal allows the partially oxidized silicon layer to separate into distinct layers of silicon and SiO2, producing a buried oxide layer. This method provides a low cost means of producing silicon-on-insulator (SOI) wafers.

8 Claims, 3 Drawing Sheets

ANNEALED POROUS SILICON WITH EPITAXIAL LAYER FOR SOI

This application claims priority under 35 USC §119(e)(1) of provisional application No. 60/086,959 filed May 28, 1998.

BACKGROUND AND SUMMARY OF THE INVENTION

The present invention relates to integrated circuit structures and fabrication methods, and especially to the formation of silicon-on-insulator substrates.

Background: Silicon-on-Insulator Technology

Silicon-on-insulator (SOI) technology is so-called because a thin layer of monocrystalline silicon is formed over an insulator and substrate. The ability to provide a silicon area which is completely surrounded by an insulator can provide, many advantages, including simpler fabrication, reduced capacitive coupling between circuit elements, elimination of latchup, reduced chip size and/or increased packing density and increased circuit speed. Examples of this technology, and some associated problems, are listed below.

a) In bonded wafers, two semiconductor wafers with oxidized surfaces are bonded together to form a buried oxide layer. One silicon surface is thinned to the desired thickness to provide an active area for devices.

b) The process of layer transfer also bonds two wafers and thins one, but uses a wafer having an epitaxial layer of silicon over a layer of porous silicon. After bonding, the first wafer is thinned to the porous silicon layer, which is then removed by etching.

c) Separation by implanted oxygen (SIMOX) creates a buried layer of SiO2 by implanting a high dose of oxygen ions into a silicon-containing wafer, then annealing to react the implanted oxygen with the silicon to form SiO2. An epitaxial layer is sometimes grown on the surface to provide enough depth of crystalline silicon for device fabrication.

d) Full isolation by porous oxidized silicon (FIPOS) uses an epitaxial layer grown on a heavily-doped silicon surface. The heavily-doped layer is selectively converted to porous silicon by anodization through holes in the epitaxial layer, then oxidized to form a buried layer of oxide.

The methods above tend to be expensive, and several consume two wafers to form a substrate. It is difficult to achieve a uniform, minimal thickness of silicon. Other problems include the use of special equipment, defects in the active area, warpage, and stress-induced dislocations.

Further discussion of SOI can be found in Silicon Processing for the VLSI Era, Volume 2, (p 66–83), from which much of the information above was taken, and which is hereby incorporated by reference.

Background: Porous Silicon

Porous silicon is formed by anodic oxidation of a silicon wafer in a solution of hydrofluoric acid and a surfactant, such as methanol. The size of the pores, the porosity, and the thickness of the porous silicon can be controlled; pore size is typically in the range of 10–20 nm, while porosity is typically in the range of 30–70 percent.

Porous silicon has a low dielectric constant and high resistivity, which make it useful for isolation. Since porous silicon has a high surface area for its volume (a few hundred square meters per cubic centimeter), it can be oxidized much more quickly than bulk silicon.

Sato et al., "Epitaxial Growth on Porous Si for a New Bond and Etchback Silicon-on-Insulator", JOURNAL OF THE ELECTROCHEMICAL SOCIETY, Vol. 142, No. 9, September 1995, discloses a layer transfer method which produces a high-quality epitaxial layer over porous silicon, with greater uniformity of the layers across the wafer. This article is hereby incorporated by reference.

Porous Silicon in Fabrication of Silicon-on-Insulator Substrate

The present application discloses anodizing a silicon wafer to form a porous silicon layer. After partial oxidation of the porous silicon, the surface of the wafer is etched to provide a clean surface for growth and the top layer of silicon is reflowed to provide a continuous silicon surface. An epitaxial layer of silicon is then grown on the porous silicon, followed by a high temperature anneal; during the anneal, the porous silicon collapses in on its voids, forming a layer which is a mixture of silicon and SiO2. Since these two materials are not soluble in each other, they will form separate layers in the high-temperature anneal. This method has the potential to produce a silicon oxide layer with a smooth interface to a high-quality single crystal epitaxial layer, without the warpage and dislocations of the old FIPOS process. Additionally, unlike other silicon-on-insulator methods, this process can potentially produce SOI wafers at close to the same cost as bulk silicon wafers.

Advantages of the disclosed methods and structures includes high quality silicon for active areas.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
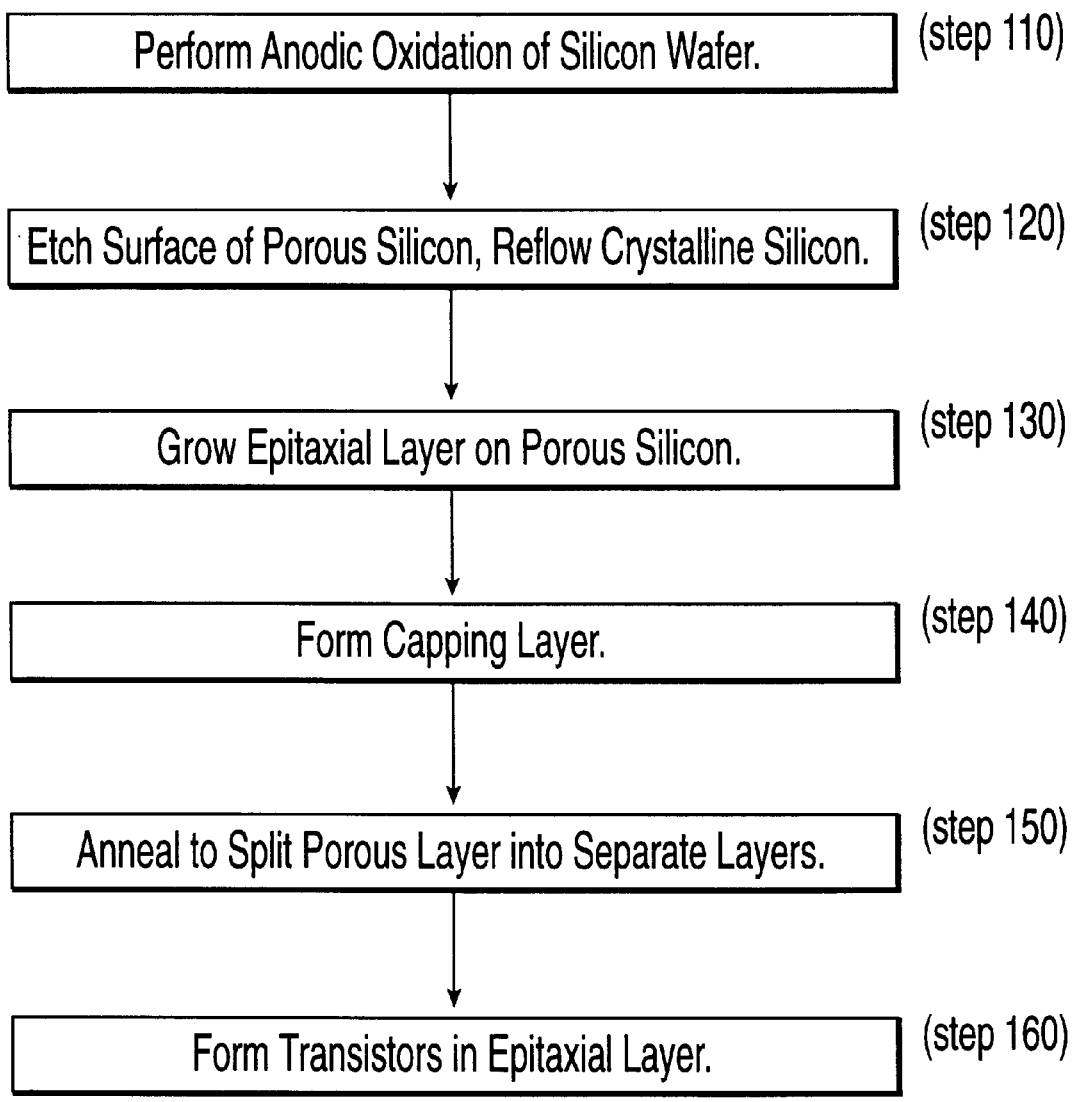
FIG. 1 is a flow chart showing key steps in the disclosed method of making a silicon-on-insulator substrate.

FIG. 1 is a flowchart of the disclosed method of forming a silicon-on-insulator substrate, and will now be discussed with reference to FIGS. 2A–D, which show a cross-section of the wafer at various points in the disclosed process.

Figure 2A:
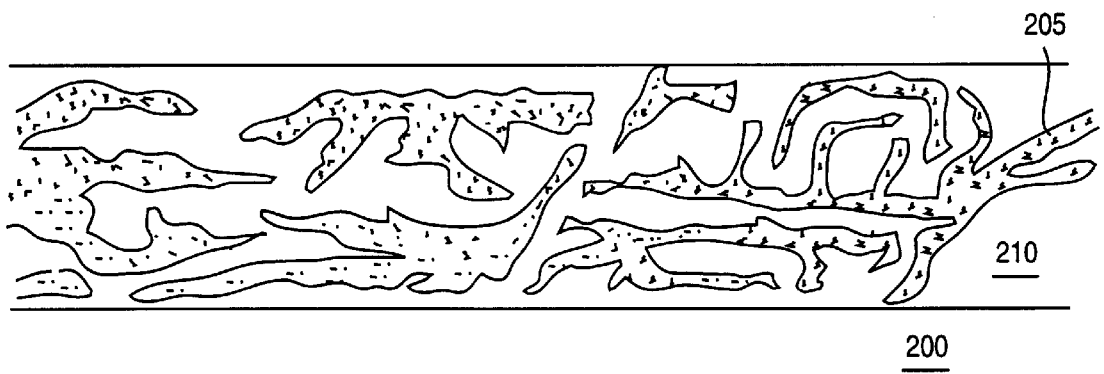
FIGS. 2A–E are cross-sections of a partially fabricated integrated circuit structure, showing formation of the disclosed SOI structure, as well as formation of transistors.

A boron-doped silicon wafer 200 is anodically oxidized (step 110) in a HF/C2H5OH/H2O solution of approximately 1:2:1 (this ratio assumes anhydrous HF; however, HF is typically supplied in a 49 percent solution in water, so with this solution, the ratio is expressed as 1:1 HF:ethanol) to form a layer of porous silicon 210 approximately 5 microns thick, having pores 205 at a density of about 30–70 percent. This layer is seen in FIG. 2A. It is important at this step for the surface portion of this layer to have low porosity with small pores on the surface of the wafer, since an epitaxial layer will be grown on top of the porous silicon. This surface portion will be on the order of 10–50 nm thick, with a higher porosity region below it. A partial oxidation of the porous silicon is performed to oxidize approximately 10–20 percent of the silicon atoms in the porous silicon layer, forming regions of SiO2 215 on the surface of the pores 205. A short dip in HF, or a plasma etch, is used to remove the oxide from the top surface of the wafer. Once the surface oxide is removed, the wafer is heated in an atmosphere of H2 at 900–1100 degrees C. for approximately 5–10 minutes. This allows the crystalline silicon to reflow and seal the pores on the surface (step 120), making the wafer surface once again single crystal silicon. These steps make it possible to create a high-quality epitaxial layer. Epitaxial layer 220 is then grown (step 130) on the porous silicon 210, using a CVD reactor with SiH2Cl2 and H2 at 800–1200 degrees C. The epitaxial layer is typically 0.1–1.0 microns or less in thickness.

Figure 2B:
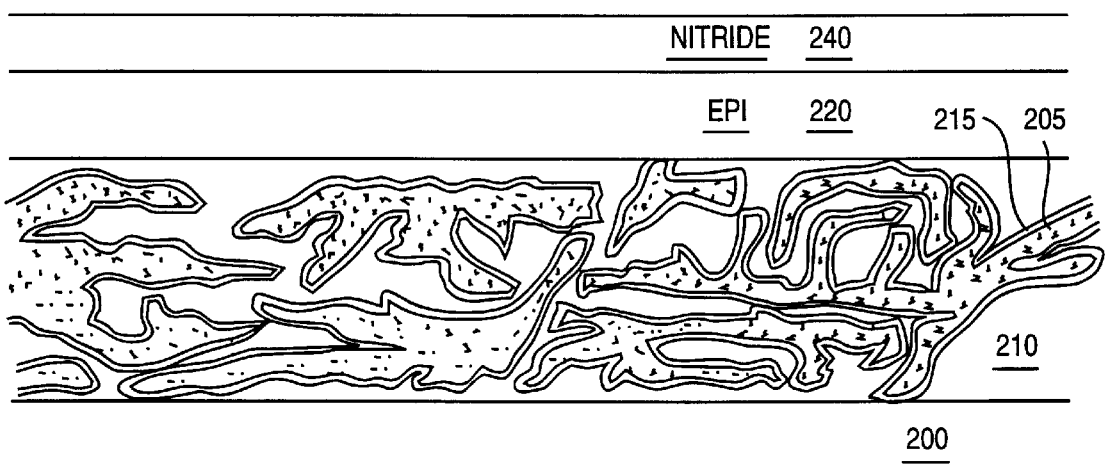
Figure 2C:
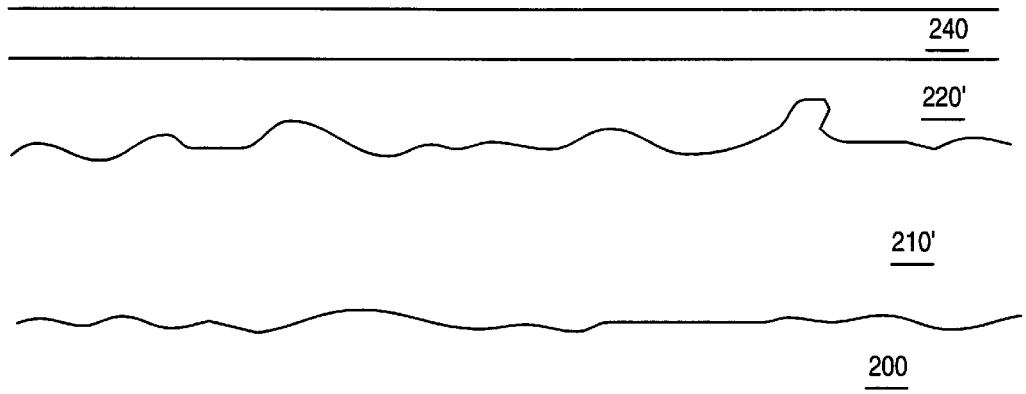
Figure 2D:
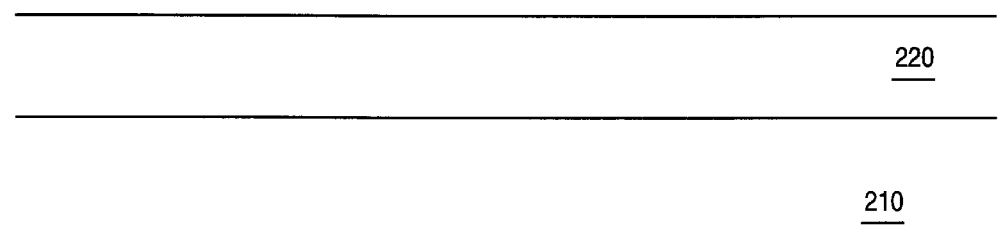
Figure 2E:
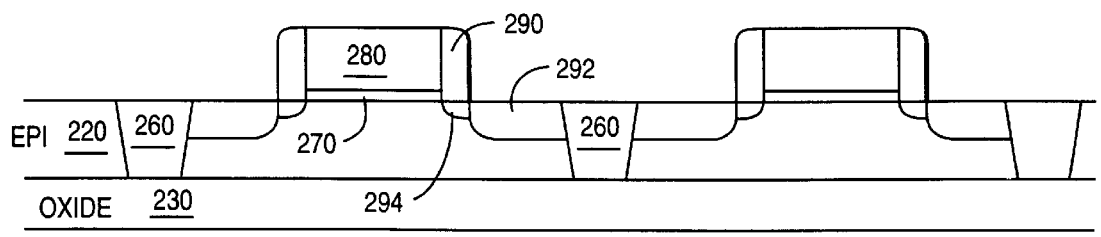

After the epitaxial layer is grown, a capping layer 240 is formed on the epitaxial layer, such as 0.1–3 microns of chemical-vapor-deposited (CVD) Si3N4. This layer can also contain an oxide, however, if an oxide is grown, care must be taken to prevent oxidation of the entire epitaxial layer. The capping layer provides structural support to the thin epitaxial layer during the anneal to follow, and is shown in FIG. 2B. The wafer is then annealed (step 150) at approximately 1325 degrees C. for approximately six hours. At this temperature, the silicon and silicon dioxide will begin to flow. This causes the porous layer to collapse in on the pores, forming masses of silicon and masses of SiO2 mixed together. As the anneal continues, these masses will randomly move past each other. When the silicon masses come in contact with the epitaxial layer or the silicon substrate, they will tend to remain in these regions because of the stronger Si—Si bonds that are formed. Thus, over time, the partially-oxidized porous silicon separates and coalesces into an oxide layer between slightly thickened epitaxial and substrate layers. FIG. 2C shows the layers when this process is partially complete, showing an irregular boundary between the substrate 200, epitaxial region 220', and oxide layer 230'. After the anneal is complete (i.e., interfaces are smooth), the wafer is cooled, then the nitride capping layer can either be stripped, or left on to facilitate formation of further isolation structures, such as shallow trench isolation (STI). FIG. 2D shows the wafer after stripping of the nitride layer. Formation (step 160) of transistors can then proceed. FIG. 2E shows partially fabricated transistors, with trench isolation 260, gate oxide 270, gate 280, sidewall spacers 290, and implanted regions 292 and 294.

Alternate Embodiment—Subsequent Oxidation

In an alternate embodiment, the anneal step is followed by a further step to improve the electrical properties of the buried oxide layer. This is accomplished by a further oxidation of the wafer at a high temperature (e.g. 1100–1350 degrees C.) for a long period (e.g. 3–4 hours) in an atmosphere of N2 with 10–40 percent O2. Some oxygen migrates past the top silicon/buried oxide interface, allowing it to react with any atomic silicon which has remained in the buried oxide layer. This step, which is also used in some SIMOX processes, improves the insulating power of the dielectric. To perform this additional oxidation, it is necessary to strip the nitride protective layer rather than leaving it on for formation of the isolation structures, as well as allowing for oxidation of some of the epitaxial layer, so this alternate embodiment is less preferred.

Alternate Time/Temperature Relationships for Anneal

The time necessary for the anneal of step 150 is dependent on the temperature used, and is variable over a range of combinations. In general, as the temperature increases, the time decreases to achieve separation of the layers and smooth interfaces. For example, an anneal at 1375 degrees would typically take 2–5 hours, while an anneal at 1275 degrees can take on the order of 10 hours to complete. These ranges are not definitive, however, as a longer time will not harm the wafer, while a shorter time can be used when interfaces are acceptable for the particular application.

Alternate Solutions for Anodic Oxidation

In the anodic oxidation process, the solution used is a mixture of HF and water with a surfactant (wetting agent). In addition to ethanol, other surfactants can be used, such as methanol, isopropanol, and TritonX-100, the latter a wetting agent well known in the industry. It appears in preliminary tests that TritonX-100 can be used in much smaller quantities, e.g. 1–2 percent of the total solution. Additionally, the literature on anodic oxidation includes references to numerous organics which are being investigated. Thus, the wetting agents mentioned do not constitute an exhaustive list, but merely a sample of the possibilities.

In addition to changing the surfactant used, the proportions of the materials can be changed, along with the anodization current, to produce porous silicon with the desired characteristics.

Alternate Embodiment—SiC Capping Layer

In an alternate embodiment, SiC can be used instead of Si3N4 to form the capping layer. Additionally, the capping layer can be a composite layer, using both SiC and Si3N4, and optionally SiO2.

Alternate Embodiment—Variable Porosity Porous Silicon

In an alternate embodiment, conditions during anodization of the silicon are controlled to provide a variable porosity in the porous silicon. Thus, by starting with a low current density for a short time, a low porosity can be produced at the surface of the wafer, followed by a higher current density to form higher porosity porous silicon in the bulk. This can be advantageous, for example, in producing a surface which requires little in the way of crystalline reflow prior to growth of the epitaxial layer.

The disclosed method has the advantage of providing both high quality silicon for active areas and a high quality, uniform thickness of oxide for insulation. It minimizes warpage of the wafer, consumes only one wafer, is low cost and easily ramped into volume production. Each advantage applies to at least one embodiment, although not every embodiment necessarily has all advantages.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

What is claimed is:

1. A method of forming a silicon-on-insulator substrate, comprising the steps of:
   (a.) anodically oxidizing a silicon wafer to produce a layer of porous silicon;
   (b.) partially oxidizing said layer of porous silicon to form silicon oxide on surfaces of pores in the layer of porous silicon;
   (c.) growing an epitaxial layer of silicon on said partially oxidized layer of porous silicon; and
   (d.) annealing said wafer to form a continuous buried oxide from the silicon oxide in the layer of porous silicon, with substantially smooth interfaces.

2. The method of claim 1, wherein said step (d.) is performed at a temperature which is greater than 1250 degrees C. for a time which is greater than two hours.

3. The method of claim 1, wherein said layer of porous silicon is formed in a boron-doped region.

4. A fabrication method, comprising the steps of:
- (a.) anodically oxidizing a silicon wafer to produce a layer of porous silicon;
- (b.) partially oxidizing said layer of porous silicon;
- (c.) etching said partially oxidized layer of porous silicon to remove the oxide of step (b.) from the top surface of said porous silicon;
- (d.) growing an epitaxial layer of silicon on said partially oxidized layer of porous silicon;
- (e.) covering said epitaxial layer with a capping layer which prevents oxidation of said epitaxial layer;
- (f.) annealing said wafer to allow said partially oxidized layer of porous silicon to separate into distinct layers which include a buried oxide layer;
- (g.) forming transistor structures in said epitaxial layer of silicon; whereby said buried oxide layer provides insulation for said transistor structures.

5. The method of claim 4, wherein step (c.) uses HF and H2O to etch oxide from the top surface of said porous silicon.

6. The method of claim 4, wherein step (c.) uses a plasma etch to etch oxide from the top surface of said porous silicon.

7. The method of claim 4, wherein said capping layer comprises Si3N4, SiC, SiO2 or any combination of these.

8. The method of claim 4, wherein said step (f.) includes an oxidation to convert silicon remaining in the buried layer into oxide.

* * * * *